(12) United States Patent
Diaz Fortuny et al.

(10) Patent No.: US 12,736,579 B2
(45) Date of Patent: Sep. 15, 2026

(54) TAMPER-AWARE AGE SENSOR

(71) Applicants: Imec vzw, Leuven (BE); Katholieke Universiteit Leuven, KU LEUVEN R&D, Leuven (BE)

(72) Inventors: Javier Diaz Fortuny, Heverlee (BE); Erik Bury, Ramillies (BE); Michiel Vandemaele, Leuven (BE); Robin Degraeve, De Pinte (BE); Benjamin Kaczer, Heverlee (BE)

(73) Assignees: Imec vzw, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 190 days.

(21) Appl. No.: 18/850,847

(22) PCT Filed: Mar. 25, 2022

(86) PCT No.: PCT/EP2022/058034
§ 371 (c)(1),
(2) Date: Sep. 25, 2024

(87) PCT Pub. No.: WO2023/179882
PCT Pub. Date: Sep. 28, 2023

(65) Prior Publication Data
US 2025/0208199 A1 Jun. 26, 2025

(51) Int. Cl.
*G01R 31/28* (2006.01)

(52) U.S. Cl.
CPC ................................ *G01R 31/2875* (2013.01)

(58) Field of Classification Search
CPC ............ G01R 31/2875; G01R 31/2817; G01R 31/2856
See application file for complete search history.

(56) References Cited

U.S. PATENT DOCUMENTS

2014/0103344 A1 4/2014 Tehranipoor et al.
2015/0061711 A1 3/2015 Hamilton
(Continued)

FOREIGN PATENT DOCUMENTS

CN 109765476 A 5/2019

OTHER PUBLICATIONS

International Search Report, Application No. PCT/EP2022/058034 mailed Nov. 23, 2022, 3 pages.
(Continued)

*Primary Examiner* — Dominic E Hawkins
(74) *Attorney, Agent, or Firm* — McDonnell Boehnen Hulbert & Berghoff LLP

(57) ABSTRACT

Examples include a sensor for estimating the operating age of an integrated circuit experiencing performance degradation and a related tamper detection method. The sensor is operable in a regular use mode or in a readout mode and includes a performance monitor responsive to temperature stress and voltage stress, and an anneal monitor responsive to temperature stress. The performance monitor is configured to receive an operating voltage of the integrated circuit when the sensor is operated in the regular use mode. Each anneal monitor is a pre-stressed monitor, and each performance monitor and each anneal monitor is configured to generate an output signal indicative of the performance degradation for the respective monitor when the sensor is operated in the readout mode.

20 Claims, 5 Drawing Sheets

(56) References Cited

U.S. PATENT DOCUMENTS

| | | | | |
|---|---|---|---|---|
| 2016/0164518 | A1* | 6/2016 | Ludlow | G06F 21/86 307/116 |
| 2020/0186350 | A1* | 6/2020 | Wentz | H04L 9/3247 |
| 2022/0260630 | A1* | 8/2022 | Fayneh | G01R 31/3016 |

OTHER PUBLICATIONS

Written Opinion, Application No. PCT/EP2022/058034 mailed Nov. 23, 2022, 5 pages.

Vandemaele et al., “The Influence of Gate Bias on the Anneal of Hot-Carrier Degradation”, IEEE Xplore, 2020, 7 pages.

Vandemaele et al., “Modeling of Repeated FET Hot-Carrier Stress and Anneal Cycles Using Si—H Bond Dissociation/Passivation Energy Distributions”, IEEE Transactions on Electron Devices, 2021, 68(4), 1454-1460.

Dimopoulos et al., “Novel MOSFET Operation for Detection of Recycled Integrated Circuits”, IEEE, 2018, 1038-1041.

Keane et al., “On-chip reliability monitors for measuring circuit degradation”, Microelectronics Reliability, 2010, vol. 50, 1039-1053.

Keane et al., “An All-In-One Silicon Odometer for Separately Monitoring HCI, BTI, and TDDB”, IEEE Journal of Solid-State Circuits, 2010, 45(4), 817-829.

Sahoo et al., “A novel area efficient on-chip RO-Sensor for recycled IC detection”, Integration, the VLSI Journal, 2020, vol. 70, 138-150.

Zhang et al., “Design of On-Chip Lightweight Sensors for Effective Detection of Recycled ICs”, IEEE Transactions on Very Large Scale Integration (VLSI) Systems, 2014, 22(5), 1016-1029.

Guin et al., “Design of Accurate Low-Cost On-Chip Structures for Protecting Integrated Circuits Against Recycling”, IEEE Transactions on Very Large Scale Integration (VLSI) Systems, 2016, 24(4), 1233-1246.

* cited by examiner

TAMPER-AWARE AGE SENSOR

CROSS-REFERENCE TO RELATED APPLICATIONS

The present application is a § 371 national stage of international application no. PCT/EP2022/058034, filed on Mar. 25, 2022, the contents of which are hereby incorporated by reference.

FIELD OF THE DISCLOSURE

The present disclosure relates to tamper-aware age sensors and their use for in-chip monitoring of performance degradation and detection of tampering attacks trying to conceal the true operating age of an integrated circuit containing the age sensor.

The disclosure also relates to age sensors for in-chip monitoring of performance degradation that allow a reliable estimation of the true operating age of an integrated circuit by taking into account unusual or suspicious operating conditions of an integrated circuit containing the age sensor.

BACKGROUND

Age sensors, also referred to as age monitoring sensors, silicon age monitors, silicon odometers, or performance degradation monitors, are widely used on-chip components that are used to monitor, in situ, aging and degradation effects that negatively affect the performance of an integrated circuit (IC) or even put the correct functioning of the IC at risk, i.e. malfunctioning of the IC or malfunctioning of parts thereof which are caused by aging effects. In such cases, an output signal of the age sensor can be used to take preventive or protective measures such as regulating the operating conditions of the IC. Typically, a clock frequency for the IC is reduced.

Aside from the implementation of protective measures for the safe operation of an IC, on-chip age sensors are frequently used as anti-counterfeiting means. Obtaining or deriving an estimate of the operating age of an IC from the output of an on-chip age sensor allows the customer to compare the estimated, sensor-based operating age of the IC to the declared age of the IC from the vendor. On one hand, a counterfeited IC or an IC that has been tampered with can be detected in the case that sensor-based age information differs from the vendor-declared age information. On the other hand, the sensor-based age information matching the vendor-declared age information of the IC can reassure the customer that the vendor can be trusted.

Accurately estimating the true operating age of a semiconductor IC becomes increasingly important in the context of a circular economy in which chips are recycled. For example, functional chips can be removed from damaged or dysfunctional circuit boards and refurbished for re-use in new electronic devices. The quality and expected lifetime of new electronic devices that contain recycled chips depends on the operating age of the chips that have been recycled. Especially when there is a shortage of chips on the worldwide market, customers may be tempted to buy from untrusted vendors which may offer recycled chips at a lower price, but without knowing whether the operating age of the recycled chips as declared by the vendor corresponds to the true operating age. Malicious vendors may also try to artificially rejuvenate their recycled chips by annealing them at high temperatures to cure defects.

Accurately estimating the true operating age of a semiconductor IC is of uttermost importance in military and medical equipment, where human life depends on the reliable functioning of the semiconductor chips over the entire lifetime of the chip, which is typically specified by the vendor. Military and medical equipment is expensive in general and often becomes profitable only when the equipment is used during the entire lifetime.

US 2014/0103344 A1 discloses an apparatus for distinguishing used integrated circuits, such as recycled or counterfeited ICs, from ones which are not previously used. In one embodiment, the apparatus-a die recovery sensor-comprises a stressed ring oscillator, i.e. a ring resonator subjected to voltage stress, and a reference ring oscillator which are embedded into an IC. A frequency shift between the stressed and the reference ring oscillator serves as a fingerprint of the IC and is indicative of the age of the IC. Moreover, statistical data analysis permits separation of process and temperature variations from the aging effects.

The disclosed apparatus has the disadvantage that a reference ring oscillator is always required to estimate the age of the IC, which makes the reliable functioning of the apparatus vulnerable to tampering of the reference ring oscillator. Moreover, the stressed ring oscillator can be manipulated by an anneal attack to cure, at least partially, the suffered degradation and thus conceal the true age of the IC containing the stressed ring oscillator. Anneal attacks are performed at elevated temperatures, much higher than the expected fluctuations in the operating temperature that form the basis of the statistical data analysis for the disclosed apparatus.

Hence, there is a need for age sensors that are capable of accurately estimating the operating age of an integrated circuit and for which the true operating age cannot be easily concealed by a tampering attack such as an anneal attack.

SUMMARY

It is a potential benefit of embodiments of the present disclosure to provide an age sensor for integrated circuits, that estimates the operating age of the integrated circuit and that informs the user of fraudulent anneal attacks aiming at artificially rejuvenating the integrated circuit.

In a first aspect, the disclosure relates to sensor for estimating the operating age of an integrated circuit experiencing performance degradation. The sensor is selectively operable in a regular use mode or in a readout mode and comprises at least one performance monitor responsive to temperature stress and voltage stress. The at least one performance monitor is configured to receive a nominal operating voltage of the integrated circuit as input signal when the sensor is operated in the regular use mode and experiencing performance degradation. The sensor comprises at least one anneal monitor responsive to temperature stress. Each anneal monitor is a pre-stressed monitor accounting for an accelerated relaxation of the degradation in the performance and anneal monitors during a fraudulent anneal attempt. Each performance monitor and each anneal monitor is configured to generate an output signal indicative of the performance degradation for the respective monitor when the sensor is operated in the readout mode.

The sensor is an age sensor since it allows monitoring of the age-dependent degradation state of the performance monitor. This degradation state is representative of the degradation state of an integrated circuit in embodiments in which the sensor is embedded in the integrated circuit. The sensor is capable of detecting a fraudulent anneal attack in which the sensor is subjected to a high temperature anneal treatment with the aim of turning back or neutralizing the degradation suffered by the performance monitor. The detection capability is achieved by a second monitor, i.e. the anneal monitor, which is a pre-stressed monitor. In a pre-stressed monitor, an anneal attack causes a reduction of the inherently high initial degradation present in the pre-stressed monitor.

In a second aspect, the disclosure relates to a sensor for estimating the operating age of an integrated circuit experiencing performance degradation. The sensor is selectively operable in a regular use mode or in a readout mode and comprises at least one performance monitor responsive to temperature stress and voltage stress. The at least one performance monitor is configured to receive a nominal operating voltage of the integrated circuit as input signal when the sensor is operated in the regular use mode and experiencing performance degradation. The sensor comprises at least one anneal monitor responsive to temperature stress. Each anneal monitor comprises an electrical isolation structure that permanently disconnects and isolates input connectors of the anneal monitors from the nominal operating voltage. Moreover, each performance monitor and each anneal monitor is configured to generate an output signal indicative of the performance degradation for the respective monitor when the sensor is operated in the readout mode.

The electrical isolation structure may be provided as a portion of an input connector of the respective anneal monitor that is fusible and has been blown to leave a gap. The electrical isolation structure prevents the user from accessing and applying a voltage stress signal to the input connector of the respective anneal monitor.

According to embodiments of the disclosure, the sensor may comprise a readout unit. The readout unit is configured to detect the output signals generated by the performance monitors and anneal monitors and to determine, based on the detected output signals, a performance variable for each performance monitor and each anneal monitor. The performance variables are a digital representation of the performance state of the respective monitor.

The disclosure also relates to a sensor system comprising the age sensor of the first aspect and an analysis unit configured to receive performance variables determined by the readout unit, detect a change in the performance variable for each performance monitor, and based thereon, generate an estimate of the operating age of the integrated circuit.

In-situ performance degradation monitoring can be obtained at the same time as tamper detection in ICs containing the age sensor. In-situ performance degradation monitoring is a valuable source of information that chip manufacturers are often very keen to obtain for feedback. This field data allows the chip manufacturers to identify reasons for chip failure when the chip is reaching the end of its expected lifetime, or in case of early failure, and allows the chip manufacturers to improve their processing steps. The field data also enables comparison of the actual aging suffered by the chip with the age models for the chip that have developed by virtue of accelerated device testing.

Sensor output can be generated without requiring a reference signal generator, which can be the target of tampering attacks.

The output signals generated by the age sensor can be analyzed, e.g. post-processed and further analyzed, in software or in hardware. A hardware or software implementation of an analysis unit can be provided to this effect. A software implementation of the analysis unit, or an analysis unit that is composed of existing components of the IC that also contains the age sensor, has the benefit that the age sensor itself requires less resources, is more compact, and less expensive.

Different fraudulent attacks can be detected by a single age sensor, including anneal attacks, i.e. high temperature anneal attacks, and overvoltage attacks, e.g. overclocking the IC with by application of higher operating voltage (higher than the nominal operating voltage) to which the age sensor is also tied.

A tamper-resilient age sensor can be provided in a compact form, e.g. as an IP block for integrated circuit design, which can be easily integrated and reused in many different IC designs. No additional processing masks or materials are required during the manufacturing of the IC; only design space for the IP block has to be allocated. Moreover, a tamper-resilient age sensor can be adapted to function reliably with respect to different fabrication technologies, including commercial CMOS technology nodes.

A single age sensor can take into account different degradation mechanisms, such as bias temperature instability (positive and/or negative), hot carrier degradation, and/or electromigration. More particularly, the different relaxation behaviors associated with these different degradation mechanisms can be accounted for so that accurate estimations of the operating age of an IC comprising the age sensor are obtained. Age sensors have specifically adapted performance and/or anneal monitors that enhance one of the degradation mechanisms over the other degradation mechanisms contributing to the aging of the IC that contains the age sensor. Some embodiments of the disclosure may include a performance monitor in the age sensor, which is specifically adapted to enhance the degradation by hot carrier effects, e.g. a hot carrier injection-enhanced performance monitor, the generated output signals of which are affected more strongly by the use time of the IC containing the age sensor, thereby allowing more accurate estimates of the operating time/age of the IC.

In yet another aspect, the disclosure relates to a method for detecting fraudulent anneal attempts in an age-monitored integrated circuit. The method comprises providing a sensor according to the first or second aspect of the disclosure, detecting a performance degradation of the at least one anneal monitor of the sensor, and signaling anneal tampering if the detected performance degradation of the at least one anneal monitor falls below a predetermined threshold value.

The method may further comprise the steps of: subjecting the at least one performance monitor of the sensor to regular voltage stress by applying a nominal operating voltage of the integrated circuit to an input of the at least one performance monitor, while the at least one pre-stressed anneal monitor is not subjected to voltage stress. A performance degradation of the at least one performance monitor is then detected and an operating age of the age-monitored integrated circuit estimated, provided that no anneal tampering has been signaled. The estimate is based on the detected performance degradation of the at least one performance monitor.

According to embodiments of the disclosure, providing the sensor of the first aspect may include providing at least one performance monitor and at least one anneal monitor, wherein the at least one performance monitor and at least one anneal monitor are responsive to voltage stress and temperature stress and configured to generate an output signal that is indicative of a degradation state of the respective monitor; subjecting the at least one anneal monitor to a voltage stress signal by applying the voltage stress signal to an input connector of the at least one anneal monitor, whereby pre-stressing of the at least one anneal monitor is obtained through accelerated degradation under the applied voltage stress signal; and permanently isolating the input connector of the at least one anneal monitor so that it becomes inaccessible during any further application of the voltage stress signal. Permanently isolating the input connector of the at least one anneal monitor may include blowing a fuse provided in a fusible portion of the input connector of the at least one anneal sensor, wherein said blowing of the fuse occurs simultaneously to the pre-stressing the at least one anneal monitor.

Aspects of the invention are set out in the accompanying independent and dependent claims. Features from the dependent claims may be combined with features of the independent claims and with features of other dependent claims as appropriate and not merely as explicitly set out in the claims.

The above and other aspects of the disclosure will be apparent from and elucidated with reference to the embodiment(s) described hereinafter.

BRIEF DESCRIPTION OF THE FIGURES

The disclosure will now be described further, by way of example, with reference to the accompanying drawings, in which.

Figure 1:
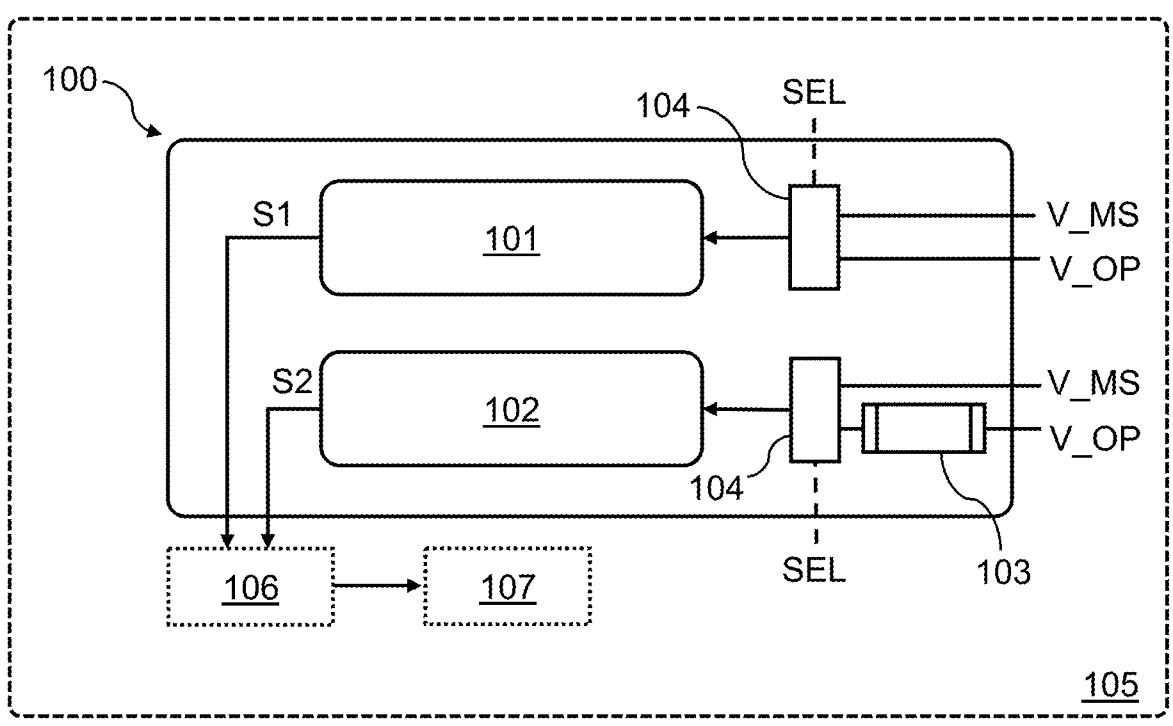
FIG. 1 shows an age sensor according to an example.

The drawings are schematic and are non-limiting. In the drawings, the size of some of the elements may be exaggerated and not drawn to scale for illustrative purposes. The dimensions and the relative dimensions do not necessarily correspond to actual reductions to practice of the invention.

DETAILED DESCRIPTION

The present disclosure is described herein with respect to embodiments and with reference to certain drawings but the disclosure is not limited thereto.

The terms first, second, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment. Furthermore, the particular features, structures, or characteristics may be combined in any suitable manner, as would be apparent to one of ordinary skill in the art from this disclosure, in one or more embodiments.

Similarly, it should be appreciated that in the description of embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

A sensor for estimating the operating age of an integrated circuit experiencing performance degradation is also referred to as age sensor. Tamper awareness of the age sensor means that the age sensor is capable of detecting and collecting information regarding tampering attacks, in particular fraudulent anneal attacks, and inform or alert the user accordingly. Hence, even though the age sensor is not resistant to tampering attacks per se, i.e. in the sense that it can be physically manipulated with a fraudulent intent, the tamper-aware age sensor is tamper-proof in the sense that tampering attacks can be detected reliably. In the following description, the terms tamper-aware, temper-resilient, and tamper-proof are used interchangeably.

In a first aspect, the disclosure relates to a tamper-aware age sensor for estimating the operating age of an integrated circuit (IC) or integrated circuit die. The age sensor is typically integrated into the IC, the age of which is to be monitored.

FIG. 1 illustrates a tamper-aware age sensor 100 according to an embodiment of the disclosure. The age sensor 100 comprises a performance monitor 101, a pre-stressed anneal monitor 102, an input signal selector 104, and an input isolation means 103 for permanently isolating the anneal monitor 102 from an input signal connector for receiving a nominal operating voltage (V_OP) of an IC. The mode of operation for the age sensor 100 can be toggled between a regular use mode and a readout mode, which will be described further below. Typically, the age sensor 100 forms part of a larger integrated circuit (IC) 105, e.g. the age sensor 100 is provided as an on-chip sensor module for in-situ monitoring of performance degradation. The IC 105 is powered and operates at a nominal operating voltage V_OP, e.g. at V_OP=0.9 V. An output signals S1 and an output signal S2 of the age sensor 100 are supplied to a readout unit 106 that is adapted to detect the output signal S1 and the output signal S2 and to convert them into digital signals representative of a degradation level for the performance monitor 101 and a degradation level for the anneal monitor 102. An input of an analysis unit 107 is connected to an output of the readout unit 106. The analysis unit 107 is configured to determine an estimate of the operating age of the IC 105 containing the age sensor 100 and further to detect tampering of the IC 105 containing the age sensor 100, in particular any fraudulent anneal attack.

Although shown as being part of the IC 105, the readout unit 106 may be an integral part of the age sensor 100 in alternative embodiments, or may be shared among different age sensors in embodiments that include a plurality of age sensors. In some embodiments, the readout unit 106 may be provided off-chip, for instance, if the output signals S1 and the output signal S2 are supplied to a pair of readout electrodes (e.g. pads) from which they can be read out by a needle probe. Likewise, the analysis unit 107 may be provided as part of the age sensor 100 in some embodiments, or may even be external to the IC 105. The analysis unit may be hardware-implemented, e.g. as a dedicated or general purpose processing unit, or may be software-implemented.

The performance monitor 101 is a measurement circuit adapted for monitoring a performance degradation of its underlying circuit components (e.g. transistors), which is assumed to be representative of the performance degradation experienced by the IC 105 on which the age sensor 100 is provided. Therefore, the performance monitor 101 is configured to receive the nominal operating voltage V_OP of the IC 105 as input signal when the age sensor 100 is operated in the regular use mode. This input signal exerts a voltage stress on the components of the performance monitor 101 that will degrade (e.g. through the creation of defects) as a function of the magnitude, duration, and frequency (if applicable) of the input signal. Degradation mechanisms include bias temperature stress, a static stress component exerted on transistor gates subjected to a bias voltage, and hot carrier degradation, a dynamic stress component caused by highly-energetic carrier generation in conducting transistor channels, electromigration, or a combination of both. These degradation mechanisms are well-known in the field of semiconductor device reliability testing and are described in greater detail in publications that belong to the state of the art. The performance monitor 101 is further configured to generate an output signal S1 that is indicative of its performance degradation state when the age sensor 100 is operated in the readout mode.

To make the age sensor 100 tamper-aware, an anneal monitor 102 is provided in addition to the performance monitor 101. Similar to the performance monitor 101, the anneal monitor 102 is a measurement circuit adapted for monitoring a performance degradation of its underlying circuit components (e.g. transistors). The anneal monitor 102 is configured to receive a measurement voltage V_MS and to generate an output signal S2 indicative of its performance degradation state when the age sensor 100 is operated in the readout mode. However, the anneal monitor 102 is inactive, e.g. unpowered, when the age sensor 100 is operated in the regular use mode. In contrast with the performance monitor 101, the anneal monitor 102 is disconnected from the nominal operating voltage V_OP of the IC 105 when the age sensor 100 is operated in the regular use mode. Furthermore, the anneal monitor 102 is a pre-stressed monitor, i.e. a monitor characterized by a significant amount of initial performance degradation. Components of the pre-stressed anneal monitor 102 comprise a large amount of defects, e.g. larger than the amount of defects present in the components of the performance monitor 101, which are introduced intentionally at the time of fabrication. Pre-stressing of the anneal monitor 102 is explained in more detail below.

Some embodiments use performance monitors that are unstressed, i.e. substantially free of initial pre-stress and containing only a limited number of defects in its components. Performance monitors are thus generally not subjected to accelerated aging by virtue of a high voltage stress signal at the time of fabrication. Nonetheless, some embodiments may involve some pre-stressing of the performance monitors as well, provided that the amount of pre-stress in the anneal monitor(s) exceeds the amount of pre-stress in the performance monitor(s) by, e.g. more than 10%, more than 20%, 30% or more, or between 50% and 80%. The skilled person will appreciate that the amount of pre-stress may be quantified in different terms, including an average defect density present in components of the performance or anneal monitor (e.g. gate oxide defects in FETs), frequency shifts in frequency-based performance monitors or anneal monitors (e.g. operating at a particular frequency that is degrading and generating output signals related to this frequency), current shifts in current-based performance monitors or anneal monitors (e.g. operating or switching at a particular current that is degrading and generating output signals related to this current), threshold voltage shifts in performance monitors or anneal monitors that use FETs, etc.

The performance monitor 101 and anneal monitor 102 may be implemented as identical structures (differing only in their number of defects) or as different structures. Implementations of the performance monitor 101 and the anneal monitor 102 may include, without being limited thereto, the following electronic structures or devices: current mirrors, ring oscillators, or single transistor devices (e.g. FETs). Even if implemented as similar structures, e.g. ring oscillators, the performance monitor 101 and the anneal monitor 102 may still differ in their specific design parameters, e.g. having a different number of oscillator stages (e.g. inverter stages) in the ring oscillator structure.

The readout unit 106 is adapted to detect the output signal S1 and the output signal S2 that are generated by the performance monitor 101 and the anneal monitor 102. By way of example, a readout unit 106 may comprise or consist of a current sensor if the performance monitor 101 and the anneal monitor 102 are implemented as current mirrors, or may comprise or consist of a frequency counter if the performance monitor 101 and the anneal monitor 102 are implemented as ring oscillators.

In another example, a single device FET can be used as the performance monitor 101 and/or the anneal monitor 102.

In this case, the FET-based monitor can be used as a power switch in a ring oscillator, wherein the ring oscillator acts as a load. One or more pFETs of the invertor stages in the ring oscillator can be connected to the single FET-based monitor that is degrading. The current of the power switch may then be read out by the readout unit 106, which may comprise circuitry like current mirrors, sense amplifiers, current-to-voltage converters, etc.

The input isolation means 103 is a permanent tamper-proof disconnection means or access blocking means such as an intentional gap provided in a current conductor or an intentionally destroyed input pin. In some embodiments, the input isolation means 103 is provided as a fusible connection, e.g. a fuse, which has been blown such that an open circuit is established between the anneal monitor 102 and the input connector that received the nominal operating voltage V_OP of the IC 105. Thus, the user is barred from interfering with the anneal monitor 102, e.g. with a fraudulent intent, once it has been successfully fabricated, packaged, and pre-stressed. A fusible connection for the input isolation means 103 can be specifically designed to blow after a predetermined time of current-forcing. This facilitates the precise control of the amount of pre-stress applied to the anneal monitor 102, which terminates automatically when the fusible connection blows. Here, the amount of pre-stress may be defined by the constant or time-dependent voltage or current stress signal that is used to achieve accelerated performance degradation in the anneal monitor 102 and the time duration the voltage or current stress signal is applied to the anneal monitor 102. In general, the voltage stress signal for accelerated performance degradation has a larger magnitude than the nominal operating voltage V_OP applied during the regular use mode. Typically, the nominal operating voltage received by the age sensor is equal or close to a positive supply voltage (e.g. VDD) of the IC that comprises the age sensor, e.g. between 0.7 V and 1.3V, whereas the voltage stress signal for accelerated performance degradation may be larger than the nominal operating voltage by a factor of 1.5 to 3, e.g. an accelerated voltage stress signal at 2.4 V may be applied if the targeted nominal operating voltage is at 0.9V.

The input signal selector 104 can be provided as a selection circuit, for example a set of multiplexing structures or a set of transmission gates, and is controllable via a selection signal SEL. This selection signal facilitates switching of the age sensor 100 between a regular use mode and a readout mode.

In some embodiments, the input signal selector 104 is configured to operably connect the performance monitor 101 to the nominal operating voltage V_OP when the age sensor 100 is operated in the regular use mode, thereby subjecting it to (regular) voltage stress as also experienced by the IC 105 into which the age sensor 100 is integrated. The input signal selector 104 is also configured to operably connect the performance monitor 101 to the measurement voltage V_MS when the age sensor 100 is operated in the readout mode. As a result, the input signal selector 104 selectively connects the performance monitor 101 to the operating voltage V_OP or the measurement voltage V_MS, depending on the currently selected mode of operation for the age sensor 100. With regard to the anneal monitor 102, the input signal selector 104 allows the anneal monitor 102 to be selectively connected and disconnected from the measurement voltage V_MS. The anneal monitor 102 is operably connected to the measurement voltage V_MS when the age sensor 100 is operated in the readout mode, but can be disconnected from the measurement voltage V_MS when the age sensor 100 is operated in the regular use mode. In this way, the anneal monitor 102 does not experience unnecessary voltage stress and energy consumption can also be reduced. During fabrication and pre-stressing step of the age sensor 100, the input isolation means 103 might not yet be present or might not yet be functional. For instance, the fuse part in a fusible connection as input isolation means 103 has not been blown. Hence, the input signal selector 104 can be used to operably connect a high voltage stress signal for accelerated performance degradation to the input connector for receiving the nominal operating voltage during the pre-stressing step performed on the anneal monitor 102.

In some embodiments of the disclosure, the measurement voltage may be smaller than the nominal operating voltage, i.e. V_MS<V_OP, and the measurement voltage is applied during shorter time intervals than the nominal operating voltage. In contrast to the regular voltage stress applied through the nominal operating voltage during the regular use mode, each performance degradation measurement cycle (in the readout mode) contributes very little, e.g. insignificantly, to the overall performance degradation state of the performance monitor 101. In some embodiments, the age sensor 100 is configured for generating the measurement voltage based on the nominal operating voltage, e.g. through an internal voltage divider circuit. In some embodiments, the measurement voltage may be greater than or equal the nominal operating voltage. This may be the case, for instance, when the operating voltage (e.g. of a CPU) can vary dynamically, e.g. decreasing from a high voltage (e.g. CPU operated in burst mode) to a lower voltage (e.g. CPU operated in low-energy mode).

The output signal S1 and the output signal S2 may be generated continuously by the performance monitor 101 and the anneal monitor 102 so that they are available during the regular use mode and the readout mode. Output enable structures (not shown in FIG. 1) may be provided to selectively supply the output signal S1 and the output signal S2 when the age sensor 100 is operated in the readout mode. In that case, the selection signal SEL, or a separate control signal, may be provided to the output enable structures as control signal.

In operation, the age sensor 100 is repeatedly toggled between the regular use mode and the readout mode so that performance degradation measurements are carried out and the output signal S1 and the output signal S2 of the performance monitor 101 and the anneal monitor 102 are generated and sampled at predetermined time intervals. More precisely, these performance degradation measurements are performed when the age sensor 100 is operated in the readout mode. Both the performance monitor 101 and the anneal monitor 102 are operably coupled to a measurement voltage V_MS, which acts as a power supply source for the performance monitor 101 and the anneal monitor 102 during the readout mode. The coupling may occur via the input signal selector 104 and can last over a short period of time, e.g. the time required for accurate readout of the output signals, e.g. tens to hundreds of microseconds. The performance monitor 101 and the anneal monitor 102 then actively generate the output signal S1 and the output signal S2.

Between two subsequent performance degradation measurements, i.e. when the sensor is operated in the regular use mode, the performance monitor 101 is subjected to regular voltage stress by connecting it to the nominal operating voltage V_OP of the IC 105, e.g. connecting to a power rail of the IC 105 for supplying the nominal operating voltage, while the anneal monitor 102 stays disconnected from operating voltage V_OP of the IC 105 and is not subjected to voltage stress. As a result, the performance monitor 101 experiences performance degradation when the age sensor 100 is operated in the regular use mode, whereas the anneal monitor 102 does not experience any performance degradation but relaxes during the time the age sensor 100 is operated in the regular use mode.

The toggling of the operating mode of the age sensor 100 between the regular use mode and the readout mode may occur periodically at fixed time intervals, e.g. without intervention of the user. Alternatively, the age sensor 100 may be configured to toggle into the readout mode upon reception of a control signal, perform the performance degradation measurement, and subsequently toggle back into the regular use mode. The control signal may be issued through a control software, e.g. a user requesting the output signal of the age sensor 100, which triggers a performance degradation measurement in the readout mode, or through a hardware-implemented controller. The controller, e.g. hardware or software implemented, may be programmed in accordance with a measurement schedule, e.g. daily, weekly, etc., rule-based, e.g. after each power-on cycle, and/or event-based, e.g. after detection of performance peaks (e.g. CPU load), supply voltage peaks, etc. Not every output signal of the anneal monitor 102 has to be sampled in the readout mode. A control bit of the control signal may be set by the controller when anneal flagging, verification of the output signal from the performance monitor 101, or cross-referencing of the output signals from both the performance monitor and the anneal monitor has been requested.

The above-described way of operating the age sensor 100 may be modified in various ways. For instance, the normal use mode and the readout mode may be one and the same sensing mode of the age sensor 100 if the bias voltage for the performance degradation measurements corresponds to the nominal operating voltage of the IC 105 and the output signal is generated continuously, e.g. continuously available at an output signal connector of the ring oscillator.

Next, the tamper-awareness of the age sensor 100 is described, i.e. the capability of the age sensor 100 to detect tampering, such as fraudulent anneals.

The performance monitor 101 is not only responsive to regular voltage stress, i.e. in the form of a performance degradation induced by the nominal operating voltage, but also responds to temperature changes. In other words, the performance degradation state of the performance monitor 101 evolves as a function of applied voltage, time of applied voltage stress, relaxation time, and temperature. This evolution of the performance degradation state is mirrored by the output signal S1. As an additional complication, the performance degradation state relaxes partially as soon as the performance monitor 101 stops being subjected to the voltage stress signal, e.g. when the voltage stress is lifted, because some of the defects created in the components of the performance monitor 101 (e.g. transistors, e.g. FETs) during voltage stress conditions are reversible and heal over time. Temperature has a large influence on the relaxation and defect healing behavior of the performance monitor 101 and the age sensor 100 in general. A strong anneal, e.g. annealing the age sensor 100 at 200° C. or more, e.g. between 200° C. and 300° C. or above 300° C., can be an efficient tampering attack, because the amount of performance degradation induced by the nominal operating voltage in the performance monitor 101 can be reduced artificially to rejuvenate the age sensor 100. Indeed, annealing the performance monitor 101 in the age sensor 100 to have only very little remaining performance degradation indicated by the output signal S1 would give the impression that the age sensor 100, and by extension any IC containing the age sensor 100, is brand-new and the true operating age of the age sensor 100, and by extension the true operating age of any IC containing the age sensor 100, would be concealed by a fraudulent anneal attack. Here, very little remaining performance degradation means any residual performance degradation could be expected from die-to-die variations of an initial performance characteristic derivable from the output signal of the performance monitor 101.

To avoid that the estimation of the operating age of an IC 105 containing an age sensor 100 can be tampered with easily, e.g. by placing an IC 105 with an age sensor 100 into an oven to carry out annealing of the IC 105, the age sensor 100 includes an anneal monitor 102. Similar to the performance monitor 101, the anneal monitor 102 responds to temperature changes and its associated performance degradation level evolves as a function of relaxation time and temperature. But, unlike the performance monitor 101, the evolution of the performance degradation level for the anneal monitor 102 does not depend on the applied voltage stress and the time of applied voltage stress, because the anneal monitor 102 is decoupled from the nominal operating voltage V_OP of the IC 105 during the regular use mode of the age sensor 100, whereby the anneal monitor 102 is not subjected to regular voltage stress during the regular use mode. As for the performance monitor 101, the evolution of the performance degradation state for the anneal monitor 102 is mirrored by the corresponding output signal during the readout mode of the age sensor 100, i.e. mirrored by output signal S2.

The anneal monitor 102 is a pre-stressed monitor, meaning that a significant amount of performance degradation has been introduced intentionally into the anneal monitor 102 at the time of fabrication. This can be achieved by applying a high voltage stress signal, higher in magnitude compared with the nominal operating voltage, to the anneal monitor 102 during a predetermined period of time. This results in accelerated aging and degradation of the components in the anneal monitor 102, prior to or shortly after packaging of the age sensor 100, or of an IC 105 containing the age sensor. The corresponding input connector is then isolated from the anneal monitor 102, e.g. by an intentional rupture of the electrical connection path between the input connector and the anneal monitor 102, a destruction or safe sealing of the input connector, or any other suitable isolation means that cannot easily be tampered with, before manufacture of the age sensor 100 is completed and the age sensor 100 purchased by the user.

Here, a significant amount of initial pre-stress in the anneal monitor 102 means a level of performance degradation, i.e. as indicated by the output signal S2, which is superior or equal to the sum of the statistically expected performance variation of the anneal monitor 102 before pre-stressing (i.e. unstressed state) and the expected relaxation of performance degradation of the anneal monitor 102 over the rated or guaranteed lifetime of the age sensor 100, or lifetime of an IC 105 containing the age sensor 100, e.g. between 2-20 years, e.g. between 2-10 years, e.g. between 2-5 years. The minimum amount of initial pre-stress in the anneal monitor 102 corresponds to a minimum of amount of performance degradation induced during the pre-stressing of the anneal monitor 102 and observable through the output signal S2 generated by the anneal monitor 102. The amount of performance degradation induced during the pre-stressing of the anneal monitor 102 can be defined with respect to a reference value, e.g. with respect to the statistically expected average performance in an unstressed anneal monitor, which is a predetermined value for a given semiconductor technology and age sensor 100 layout. This reference value is typically made available to the customer as part of a specification sheet or manual for the age sensor 100 or the IC 105 containing the age sensor 100.

The statistically expected performance variation of the anneal monitor 102 relates to the statistical uncertainty in the performance of a given anneal monitor 102 prior to pre-stressing, which is due to the processing variability. In an ensemble of age sensors 100, there will be die-to-die variability with respect to the performance variable that is based on the output signal S2 of the anneal monitor 102 prior to pre-stressing. This variability persists in the ensemble of age sensors 100 even after pre-stressing the anneal monitors 102 and has to be taken into account when determining the amount of pre-stressing. The statistically expected performance variation of the anneal monitor 102 prior to pre-stressing may be expressed as a standard deviation of the performance variable, or a multiple thereof, when measured across an ensemble of age sensors 100 on different dies. Other measures of statistical deviations for the performance variable may be used instead. Likewise, the statistically expected average performance of the unstressed anneal monitor 102 corresponds to the average value of a performance variable, based on the output signal S2 of the anneal monitor 102, prior to pre-stressing, e.g. as measured for an ensemble of age sensors 100 on different dies. Depending on the particular implementation of the anneal monitor 102, the performance variable may correspond to the magnitude of the output signal S2 itself, e.g. a leakage current of a FET, a current of a current mirror, etc., or may be derived therefrom, e.g. a frequency of a ring oscillator. The statistically expected performance variation and the statistically expected average performance of the anneal monitor 102 prior to pre-stressing thus correspond to a predetermined value, which can be reproduced through statistical measurements on a plurality of age sensors with unstressed anneal monitors.

In embodiments, the performance variable, which is based on the output signal S2 generated by the anneal monitor 102, may deviate from the predetermined reference value by more than 10% in order for the anneal sensor 102 to qualify as pre-stressed. For instance, an initial deviation of the performance variable (e.g. current of a current mirror or frequency of a ring oscillator) from the reference value may be more than 20%, e.g. between 20% and 80%, e.g. between 30% and 70%, e.g. between 50% and 60%, in a new age sensor 100 immediately after pre-stressing of the anneal monitor 102. This deviation may be allowed to diminish over time as a result of non-fraudulent degradation relaxation, e.g. reaching between 10% and 30%, e.g. between 10% and 20%, at the end of the expected lifetime of the age sensor 100 or IC 105 containing the age sensor 100. The diminished deviation at the end of the expected lifetime of the age sensor 100 or IC 105 containing the age sensor 100 corresponds to the above-mentioned expected relaxation of performance degradation of the anneal monitor 102 over the rated or recommended lifetime. Depending on the application and use conditions, the expected lifetime of the age sensor 100 or the IC 105 containing the age sensor 100 may range between 5 years and 20 years.

Figure 2:
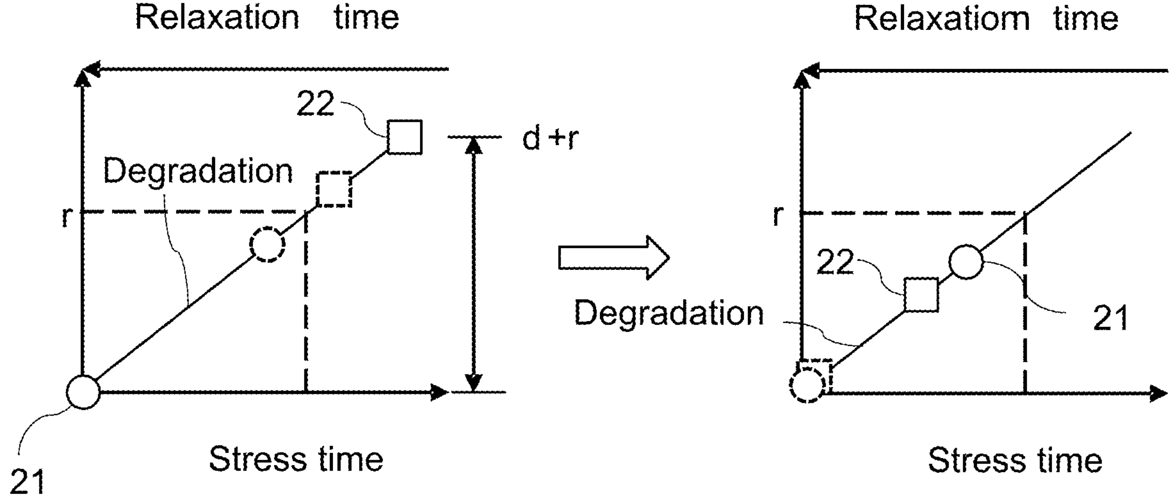
FIG. 2 shows how a fraudulent anneal attempt differently affects the degradation states of a pre-stressed anneal monitor and an initially unstressed performance monitor, which can be used for tamper detection, according to an example.

FIG. 2 shows how a pre-stressed anneal monitor 22 enables detection of a fraudulent anneal, which aims at artificially rejuvenating the age sensor 100, or an IC 105 containing the age sensor 100. A pristine condition for the performance monitor 21 and the anneal monitor 22, e.g. immediately after fabrication and pre-stressing, is schematically indicated on the left-hand side of FIG. 2 (solid circle and square markers). The pre-stressed anneal monitor 22 is intrinsically degraded to a level d+r as the result of pre-stressing, wherein r is a threshold value for the tamper detection and d is the separation between the threshold value r and the amount of intrinsic degradation in the pre-stressed anneal monitor 22. During regular use of the age sensor, the performance monitor 21 is experiencing voltage stress and is degrading over time (stress time axis), whereas the anneal monitor 22 relaxes over time (relaxation time axis). Consequently, the performance monitor 21 moves upwards along the diagonal line, while the anneal monitor moves downwards along the same line. Under regular use conditions and after a given operating time of the age sensor 100, the anneal monitor 22 will be approaching the threshold value r without crossing it (dashed square marker). At the same time, the performance monitor 21 will also accumulate damages and degrade (dashed circle marker). If the anneal monitor 22 degradation does not drop below the threshold value r, no fraudulent anneal attempt will be detected, resulting in a legitimate combination of the degradation states measured for the performance monitor 21 and the anneal monitor 22. In contrast thereto, a fraudulent anneal attempt turns back or even neutralizes the performance degradation of the performance monitor 21 in the same way as the intrinsic performance degradation of the pre-stressed anneal monitor 22. This situation is depicted in the right-hand side of FIG. 2, wherein solid markers indicate the outcome of a weak anneal attack and dashed markers the outcome of a strong anneal attack. The fraudulent attack leads to an important, sudden shift or deviation of the output signal S2 generated by the anneal monitor 22, which is not expected under regular, i.e. non-deceitful, use conditions of the age sensor 100 or IC 105 with the age sensor 100. At the end of the fraudulent anneal attack, the degradation state for the anneal monitor 22 will have dropped below the threshold value r, signaling tampering.

Hence, tampering of the age sensor 100 or the IC 105 containing the age sensor 100 can be detected and flagged during the readout mode, by determining the performance variable (indicative of the degradation state) based on the output signal S2 of the anneal monitor 102, comparing the performance variable to the predetermined threshold value, and deciding whether the threshold value has been crossed (from above). These steps can be performed in software or hardware, e.g. in a software-implemented or hardware-implemented analysis unit. The analysis unit may be provided on-chip, e.g. as analysis unit 107 which forms part of the age sensor 100 or IC 105 containing the age sensor 100, or may be provided externally to the age sensor 100 or IC 105 containing the age sensor 100.

Additionally or alternatively, the software-implemented or hardware-implemented analysis unit 107 may be programmed to determine an estimate of the operating age of the IC 105 containing the age sensor 100, based at least on the output signal S1 of the performance monitor 101, and refute or validate the age estimate based on the outcome of the decision of whether the determined performance variable for the anneal monitor 102 has crossed the threshold value or not.

In embodiments, the analysis unit 107 may be programmed, additionally or alternatively, to determine an estimate of the physical age of the age sensor 100 or the IC 105 containing the age sensor 100, based at least on the performance variable determined for the anneal monitor 102, and decide whether the combination of physical estimate and operating age estimate is feasible/allowable in the context of regular use conditions. If the combination is feasible, age information obtained with respect to the anneal monitor 102 may be used to refine the operating age estimate obtained with respect to the performance monitor 101. If the combination is infeasible, an irregular use of the age sensor 100 or the IC 105 containing the age sensor 100 is detected and the user can be notified accordingly. An analysis unit 107 may be configured to receive or store a relaxation model for the performance variable obtained from the anneal monitor 102, which describes the anneal monitor performance as a function of relaxation time and temperature, and to calculate the relaxation time using the relaxation model and measured performance variable of the anneal monitor 102 as model inputs. Temperature, which is a further model input, can be set to a nominal operating temperature for the age sensor 100 or the IC 105 comprising the age sensor 100.

An analysis unit 107 may be configured to combine information obtained from more than one performance monitor 101 and/or more than one anneal monitor 102 in embodiments in which the age sensor 100 comprises a plurality of performance monitors 101 and/or a plurality of anneal monitors 102. Such an embodiment will be described hereinbelow with reference to FIG. 6 and FIG. 7. A combination of information obtained from more than one performance monitor 101 and/or more than one anneal monitor 102 has the advantage that different degradation mechanisms can be represented and modeled in the analysis unit 107, thereby allowing a more accurate estimate of the operating age. Likewise, a combination of information obtained from more than one performance monitor 101 and/or more than one anneal monitor 102 has the advantage that the analysis unit 107 can estimate the operating age differently on different timescales, e.g. use one part of the information to estimate the operating age during the first hours or months and thereafter use another part of the information to estimate the operating age during the remainder of the expected lifetime.

The analysis unit may also be programmed to estimate the remaining lifetime of the age sensor 100 or the IC 105 containing the age sensor 100, during which the age sensor 100 or the IC 105 containing the age sensor 100 is still working reliably and is failure-safe.

Figure 3:
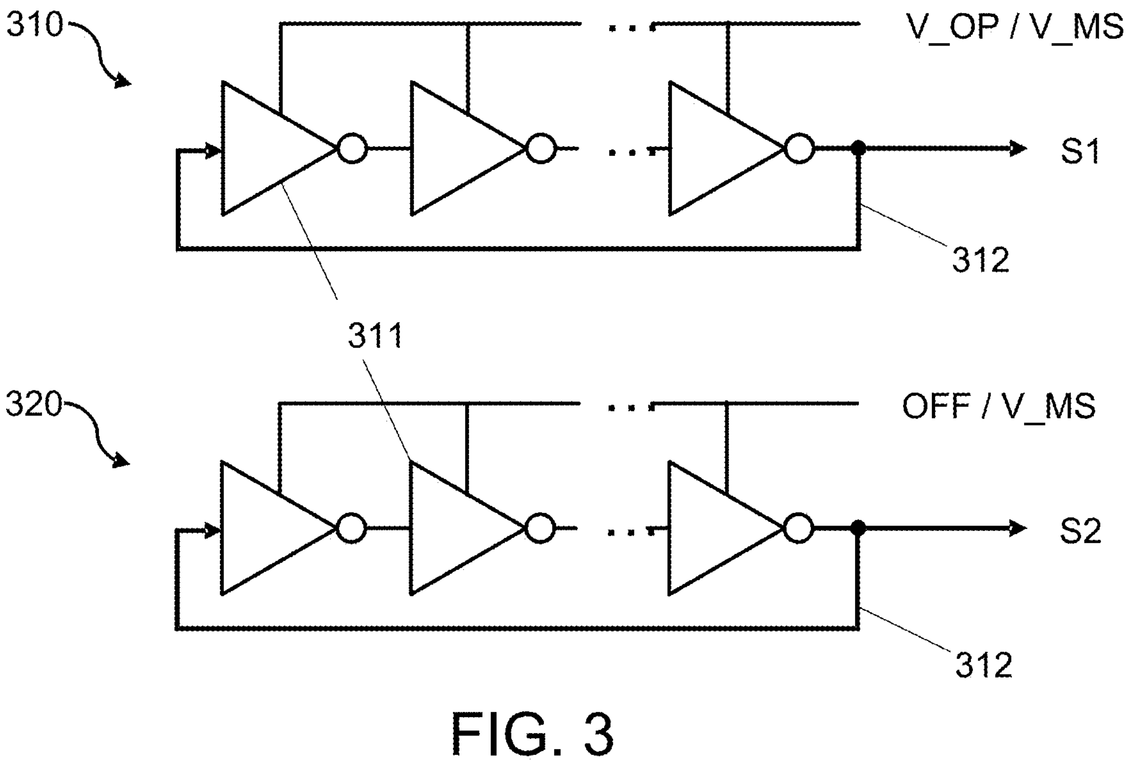
FIG. 3 illustrates a ring oscillator-based implementation of the performance and anneal monitor, according to an example.

FIG. 3 shows an example of a hardware-implementation of a performance monitor 310 and an anneal monitor 320. The performance monitor 310 and the anneal monitor 320 are measurement circuits that generate the output signal S1 and the output signal S2 when the age sensor 100 is operated in the readout mode. In this example, the performance monitor 310 and the anneal monitor 320 are implemented as electronic ring oscillators which are each comprised of a chain of inverter stages 311 (odd number of them) and a feedback signal connection 312 that connects the output of the last inverter stage of the chain back to the input of the first inverter stage of the chain. The oscillation frequency of the ring oscillators is determined by the design of the individual inverter stages and is inversely proportional to the number of inverter stages in the respective chain. The number of inverter stages may vary, depending on the technology and output signal detection technique used. The performance monitor 310 and the anneal monitor 320 may comprise between 3 and 31 inverter stages and a typical fundamental oscillation frequency may be on the order of GHz, e.g. 1-2 GHz. These numbers are given for informative purposes and embodiments of the disclosure are not limited thereto. The output signal S1 and the output signal S2 correspond to a portion of the freely oscillating signal in the performance monitor 310 and the anneal monitor 320 when biased by the measurement voltage V_MS during the readout mode of the age sensor. This portion of the freely oscillating signal in the ring oscillators may correspond to a fraction of the feedback signal that is tapped out towards an output connector of the performance monitor 310 and the anneal monitor 320, respectively. The output signal S1 and the output signal S2 are indicative of a performance degradation state (i.e. degradation level) of the respective ring oscillator and hence of an integrated circuit or integrated circuit die that comprises the age sensor 100. The oscillation frequency of the output signal S1 and the output signal S2 allows for a reliable and accurate characterization of the performance degradation suffered by the performance monitor 310 and the anneal monitor 320. During the regular use mode, the ring oscillator corresponding to the performance monitor 310 is biased by the nominal operating voltage V_OP, thus continuing oscillation and experiencing dynamic voltage stress (e.g. induced by the load currents of the switching inverters in the inverter chain) and static voltage stress (e.g. induced by biasing voltage V_OP applied to the inverters of the chain). In contrast thereto, the ring oscillator corresponding to the anneal monitor 320 is not subjected to a biasing voltage during the regular use mode, thus causing the anneal monitor 320 to stop ringing and degrading when the age sensor 100 is toggled into the regular use mode. In some embodiments, the inverter stages of the ring oscillator may be replaced by other suitable electronic stages, such as NAND-gates or NOR-gates.

Figure 4:
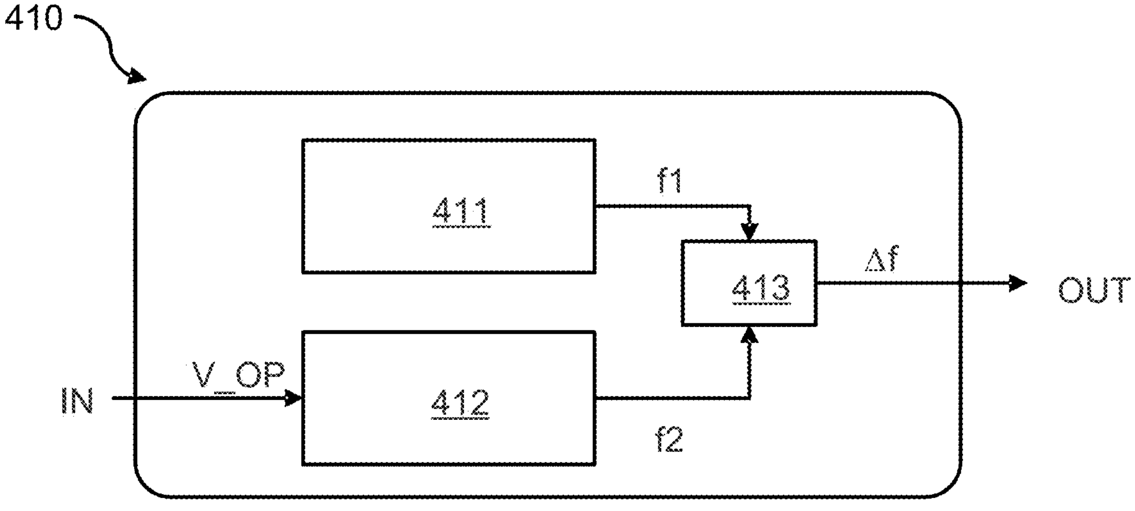
FIG. 4 shows a different implementation of a performance monitor which uses a reference ring oscillator to realize a beat note in the output signals generated by the performance monitor and the reference ring oscillator, according to an example.

Referring now to FIG. 4, a performance monitor 410 is shown, which can be used in an age sensor 100. The performance monitor 410 is frequency-based, meaning that its generated output signal “OUT” conveys information relating to the performance degradation state of the performance monitor 410 as a detectable change in the output frequency. Performance monitor 410 comprises a ring oscillator 411 and a ring oscillator 412. The first ring oscillator 411 is a functional part of the readout unit 106 and generates an intermediate output signal having a first frequency f1 and, for example, is activated (i.e. ringing) during the readout mode only. The second ring oscillator 412 generates an intermediate output signal having a second frequency f2 and is activated (i.e. ringing) during both the regular use mode and the readout mode. In the present embodiment, the output signal of the first ring oscillator 411 acts as a reference to the output signal of the second ring oscillator 412.

Ring oscillator 412 is configured to receive the nominal operating voltage V_OP as input signal for the biasing of the ring oscillator during the regular use mode (biasing connections for the readout mode are not shown in FIG. 4), thus degrading under the applied regular voltage stress. Temperature changes affect both the ring oscillator 411 and the ring oscillator 412, independently from any voltage stress, and in particular affect the performance degradation level in both ring oscillators through the defect relaxation mechanism. When the age sensor 100 is toggled into the readout mode, the output signal having the first frequency f1 and the output signal having the second frequency f2 are superimposed, whereby the superimposition of both output signals results in a beat frequency. Here, superimposition of the output signals is understood to also include the case that the two output signals are simultaneously applied to the inputs of a detection unit. The performance monitor 410 further includes a beat frequency detection unit 413 as a functional part of the readout unit 107 of an age sensor 100 that comprises the performance monitor 410. The beat frequency detection unit 413 is configured to receive the output signals from the ring oscillators 411 the ring oscillator, superimpose them if not performed prior to the reception of the output signals from the ring oscillator 411 and the ring oscillator 412, detect the beat frequency, and generate, based on the detected beat frequency, an output signal that is indicative of a frequency shift Δf between the first frequency f1 and the second frequency f2. A beat frequency detection unit may include a flip-flop and a pulse counter. The flip-flop receives the output signal of the first ring oscillator 411 as a clock signal and the output signal of the second ring oscillator 412 as an input signal and generates a pulse train at its output. The pulse train depends on the difference in frequency Δf. A pulse counter is used to determine this frequency shift from the pulse train.

An alternative anneal monitor may be similar to the performance monitor of FIG. 4, i.e. comprising a first ring oscillator as a reference and a second ring oscillator for degradation measurements, with the exception that the second ring oscillator has been pre-stressed and the input connector "IN" has been made inaccessible for the nominal operating voltage V_OP, e.g. by blowing a fusible pin immediately after fabrication and packaging.

Figures 5, 6:
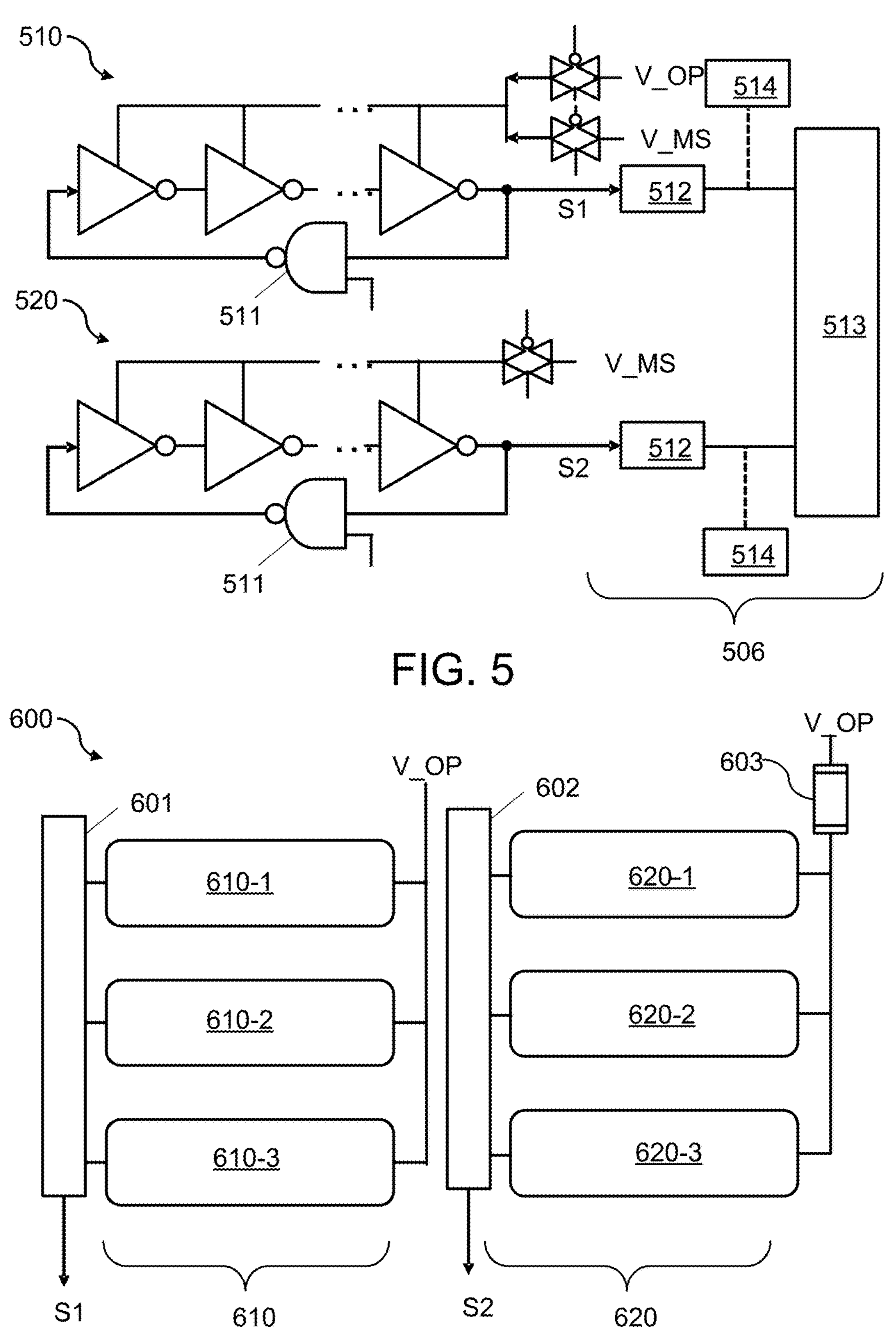
FIG. 5 is a variant of the ring oscillator-based implementation of the performance and anneal monitor shown in FIG. 3, according to an example.
FIG. 6 illustrates an age sensor, which includes a plurality of performance monitors and a corresponding plurality of pre-stressed anneal monitors, according to an example.

Referring now to FIG. 5, a variant of the performance and anneal monitor of FIG. 3 is illustrated, together with a readout unit 506. The ring oscillator 510, i.e. corresponding to the performance monitor, and the ring oscillator 520, i.e. corresponding to the anneal monitor, differ from the ring oscillators of FIG. 3 in that their feedback signal connection includes a NAND-gate as an electronic switch 511 for selectively opening and closing the feedback loop of the respective ring oscillator. The ring oscillator 510 with an open feedback line when biased by the nominal operating voltage V_OP so that the inverter stages of the ring oscillator 510 are still subjected to regular voltage stress, is prevented from oscillating and therefore only experiences a static or DC voltage stress component. This static voltage stress component causes a degradation of the performance state of the ring oscillator 510 that is dominated by the bias temperature instability (BTI) aging mechanism. It is thus a potential benefit of the electronic switch in the feedback line of the ring oscillator that the BTI aging effect, and its relaxation over time, can be isolated from and detected separately from other aging mechanisms in a performance degradation monitor using this ring oscillator. Contrarily, when the electronic switch 511 is closed, thereby closing the feedback line of the ring oscillator 510, the ring oscillator, 510 when biased by the nominal operating voltage V_OP, is no longer prevented from ringing and the inverter stages of the ring oscillator 510 start switching dynamically. As a result, the ring oscillator 510 having its feedback connection closed, experiences both a static (i.e. DC) voltage stress component and a dynamic (i.e. AC) voltage stress component at the same time. As stated above, the static voltage stress component causes a degradation of the performance state of the ring oscillator 510 that is dominated by the bias temperature instability (BTI) aging mechanism. Thereto is added the dynamic stress component, which causes a degradation of the performance state of the ring oscillator 510 that is dominated by the hot carrier degradation (HCD) mechanism, e.g. including hot carrier injection. In a performance monitor using the ring oscillator 510 with closed feedback connection, the static and the dynamic voltage stress components cannot be measured independently from each other and the BTI aging mechanism cannot be isolated from the HCD aging mechanism. There exists however a possibility to enhance the HCD aging mechanism in the ring oscillator of the performance monitor, resulting in an HCD-enhanced performance monitor in which the HCD-effect strongly dominates over the BTI effect. This possibility is discussed below, with reference to FIG. 6. The electronic switch 511 in the ring oscillator 520, corresponding to the anneal monitor, is used to pre-stress the anneal monitor with respect to the different voltage stress scenarios, e.g. the different combination of aging mechanisms just described with reference to the ring oscillator 510.

In FIG. 5, transmission gates are used to relay the biasing voltage to the ring oscillator 510 and the ring oscillator 520 in a controlled way. Different control signals are used with respect to the ring oscillator 510, which corresponds to the performance monitor, to selectively bias the inverter stages of the ring oscillator with the nominal operating voltage V_OP when the age sensor is operated in the regular use mode and with the measurement voltage V_MS when the age sensor is operated in the readout mode. One or more frequency divider stages 512 are connected between a frequency counter 513 and the respective outputs of the ring oscillator 510 and the ring oscillator 520. The frequency counter 513 can include a digital interface, whereby a digital output of the frequency counts determined with respect to the ring oscillator 510 and the ring oscillator 520 during the readout mode is obtained. Frequency divider stage 512 and the frequency counter 513 form part of the readout unit 506 of the age sensor. The frequency divider stage 512 can be provided if the output signals of the ring oscillator 510 and the ring oscillator 520 are also made accessible to external measurement equipment, e.g. needle-probes. In such cases output pads 514 for needle-probing the frequency-divided output signal S1 and the output signal S2 of the ring oscillator 510 and the ring oscillator 520 are provided.

Input-sided transmission gates, or more generally electronic switching means, can be useful in embodiments in which the voltage stress time, i.e. the time during which the nominal operating voltage as the regular voltage stress signal is applied to the performance monitor, requires a time-dependent control. In such embodiments, a modulated version of the nominal operating voltage can be applied as an input signal that is subjecting the performance monitor to regular voltage stress. Modulating the nominal operating voltage at the input of the performance monitor can be achieved by repeatedly enabling and disabling the input connection of the performance monitor via the input-sided switching means, e.g. electronic switch. A modulation frequency for the applied nominal operating voltage may be set to be representative (e.g. proportional) to the work load of the IC containing the age sensor, or any other suitable activity measure for the IC.

In some embodiments a plurality of performance monitors and/or a plurality of anneal monitors are provided, which are subjected to different stress conditions. This allows for more flexible or complete sensing of stress parameters that affect the IC containing the age sensor.

For instance, an age sensor comprising a plurality of performance monitors may be configured to operably connect each performance sensor to a different voltage stress signal when the age sensor is operated in the regular use mode. This can be useful in applications where different parts of the IC are designed to work with different voltages, for instance a core voltage (i.e. nominal operating voltage) and an I/O voltage, where the I/O voltage exceeds the core voltage, e.g. by a factor of two or more. The outputs from each performance monitor can then be used to estimate the operating lifetime of the different parts of the IC and outputs of the different performance monitors can be combined to obtain an estimate on the remaining lifetime of the IC as a whole.

Another example is that of operably connecting each performance sensor to a different voltage stress signal when the age sensor is operated in the regular use mode, even in the case that the IC uses the nominal operating voltage as the only supply voltage or in the case that the nominal operating voltage of the IC is the only supply voltage of interest for age sensing. An age sensor may include a voltage divider and/or voltage level shifting structure for generating the different voltage stress signals from the nominal operating voltage and supplying the different voltage stress signals to the respective performance monitor. Performance monitors receiving a higher voltage stress signal during the regular use mode, e.g. increased by a factor of 1.1 or 1.2 with respect to the nominal operating voltage, experience accelerated aging relative to performance monitors receiving a lower voltage stress signal during the regular use mode. Consequently, a degradation level of the performance monitors receiving a higher voltage stress signal during the regular use mode is detected more easily and reliably in a first time period, e.g. the first hours, weeks, or months (application-dependent) of use of the IC comprising the age sensor, resulting in more accurate estimates of the operational age of the IC during this first time period. When the first time period has lapsed, the performance monitors receiving a higher voltage stress signal during the regular use mode may have degraded too much to still allow for reliable age estimates. Hence, from this moment on, operational age estimates for the IC might only be obtained with respect to the performance monitors receiving a lower voltage stress signal during the regular use mode, in which less performance degradation will have occurred. A less coarse division of the monitoring time periods for the individual performance monitors may be adopted. The operational age estimates of the different performance monitors may be validated against the physical age estimates obtained from at least one anneal monitor. Likewise, one or more anneal monitors may be used to detect anneal tampering of the age sensor or IC die containing the age sensor.

Referring to FIG. 6, an age sensor 600 comprising a set of performance monitors 610 (i.e., the performance monitor 610-1, the performance monitor 610-2, and the performance monitor 610-3) and a corresponding set of pre-stressed anneal monitors 620 (i.e., the anneal monitor 620-1, the anneal monitor 620-2, and the anneal monitor 620-3) is depicted. Although the performance monitors 610 are shown as being equal in number to the anneal monitors, different combinations of the number of performance monitors 610 and the number of anneal monitors 620 are feasible. Each performance monitor 610 of the set of performance monitors 610 is configured to receive the nominal operating voltage of the IC, V_OP, as input signal during the regular use mode, whereas the anneal monitors 620 are permanently disconnected from the nominal operating voltage V_OP, e.g. via a fused input pin 603 where the fuse has been blown immediately after fabrication of the age sensor. Although not shown in FIG. 6, the performance monitors 610 and the anneal monitors 620 are operably connectable to a measurement voltage V_MS during the readout mode. The output selector 601 and the output selector 602, e.g. pass gates, multiplexing structures, or the like, are provided to select the output signal S1 and the output signal S2 from the set of performance monitors 610 and the set of anneal monitors 620 respectively. The output signal S1 and the output signal S2 are sent towards a readout unit and an analysis unit, which may both be provided on-chip or off-chip. The age sensor, the readout unit and the analysis unit are elements of a tamper-aware age sensor system. In alternative embodiments, the readout unit and the analysis unit may be integrated into the age sensor.

The performance monitors 610 are designed to respond differently to the nominal operating voltage of the IC when applied to the respective performance monitor in the regular use mode of the age sensor 600. A different response means a different change or shift in the output signal of the respective performance monitor under identical stress conditions, i.e. identical voltage stress signal, voltage stress time, and operating temperature. Furthermore, the response of each performance monitor can be specifically designed to change the contribution of a particular aging mechanism to the overall performance degradation of that performance monitor. For instance, the first performance monitor 610-1 may be designed to degrade under the combined effects of BTI and HCD and the evolution of its output signal, or the performance variable detected with respect to the output signal may be modeled according to a first response function r1 (Vstress, tstress, T). Here, T is the operating temperature of the performance monitor and IC die, and tstress and Vstress are the stress time and stress voltage respectively. Here, stress time refers to the operating time of the performance monitor, i.e. the time during which the performance monitor has been subjected to voltage stress and degrading. It is noted that from the perspective of the anneal monitor, the stress time is contained in the relaxation time since the anneal monitor is not experiencing voltage stress during the regular use mode. The detected performance variable may be a frequency or frequency shift (e.g. if the performance monitor is a ring oscillator), a current or current shift (e.g. if the performance monitor is current mirror or ring oscillator), a shift in the threshold voltage (e.g. if the performance monitor is a FET), etc. Continuing the example, the second performance monitor 610-2 may be designed to predominantly degrade under the effect of HCD (i.e. HCD-enhanced performance monitor) and the evolution of its output signal, or the performance variable detected with respect to the output signal may be modeled according to a second response function r2 (Vstress, tstress, T). Eventually, the third performance monitor 610-3 may be designed to exclusively degrade under the effect of BTI (i.e. BTI-only performance monitor) and the evolution of its output signal, or the performance variable detected with respect to the output signal may be modeled according to a second response function r3 (Vstress, tstress, T). For each measurement cycle performed during the readout mode of the age sensor, the measured output signals for the performance monitors correspond to particular outcomes R1, R2, and R3 of the respective response functions r1, r2 and r3. In other words, one establishes the following correspondences for the tuple of stress conditions (V(i)stress, t(i)stress, T(i)) of the i-th measurement: R1=r1 (V(i)stress, t(i)stress, T(i)), R2=r2 (V(i)stress, t(i)stress, T(i)), and R3=r3 (V(i)stress, t(i)stress, T(i)).

There are different ways to obtain a different weighting of the HCD and the BTI effects with respect to the aging and degradation process experienced in each performance monitor. A BTI-only performance monitor has already been described with respect to FIG. 5, in which a feedback loop of a ring oscillator-based performance monitor can be interrupted by a switching means to cause only static voltage stress in the ring oscillator components. A combination of the BTI and HCD effects can be achieved by providing a ring oscillator-based performance monitor in which the feedback loop is closed, thus causing static and dynamic voltage stress in the ring oscillator components. The HCD effect can be enhanced so as to outweigh the BTI effect, by reducing the number of stages in the ring oscillator. Less stages have the effect of faster switching and greater oscillation frequency in the ring oscillator, which pronounces the HCD effect. Alternatively, the capacitance value of each stage in the ring oscillator can be increased to cause larger drive currents and hence a stronger HCD effect.

Providing different performance monitors that are specially adapted towards particular aging mechanisms has also the potential benefit that relaxation times can be determined more accurately in the age sensor since BTI and HCD are characterized by different relaxation behaviors.

The pre-stressed anneal monitors 620 can be designed to have a similar structure as the corresponding performance monitors 610, with the exception that they are not subjected to regular voltage stress during the regular use mode. This has the potential benefit that stress relaxation (i.e. defect relaxation with respect to reversible defects) and temperature stress affects the performance monitor and corresponding anneal monitor in the same way, which simplifies comparison and cross-referencing of their output signals, e.g. less signal post-processing steps are required to make the output signals of the performance monitor and corresponding anneal monitor comparable. More particularly, the first anneal monitor 620-1 may have the design of a BTI-only monitor, the second anneal monitor 620-2 may have the design of a combined BTI and HCD monitor, and the third anneal monitor 620-3 may have the design of an HCD-enhanced monitor. An evolution of the output signals generated by the anneal monitors 620, or performance variables derived from these generated output signals, may be modeled according to response functions q1 (T, t), q2 (T, t), and q3 (T, t) respectively. Here, the variable T and t stand for the operating temperature and the relaxation time (e.g. time since fabrication) respectively. For each measurement carried out during the readout mode, the measured output signals for the anneal monitors 620 are designated by the set of measured (i.e.) detected performance variables Q1, Q2, and Q3.

The analysis unit 702 is configured to receive the three independent measurements of performance variables R1 to R3 and determine the three unknown parameters Vstress, tstress, and T based on a model description for the three response functions r1 to r3. Moreover, the analysis unit 702 is configured to detect the presence of a fraudulent anneal by comparing at least one of the measured performance variables Q1, Q2, and Q3 to the expected outcomes of the corresponding response functions q1, q2, and q3 evaluated under regular use conditions for the operating temperature. This situation is depicted in FIG. 7 for a tamper-aware age sensor system 700 comprising an age sensor 701 with a plurality of performance monitors and a plurality of anneal sensors and an analysis unit 702.

Figure 8:
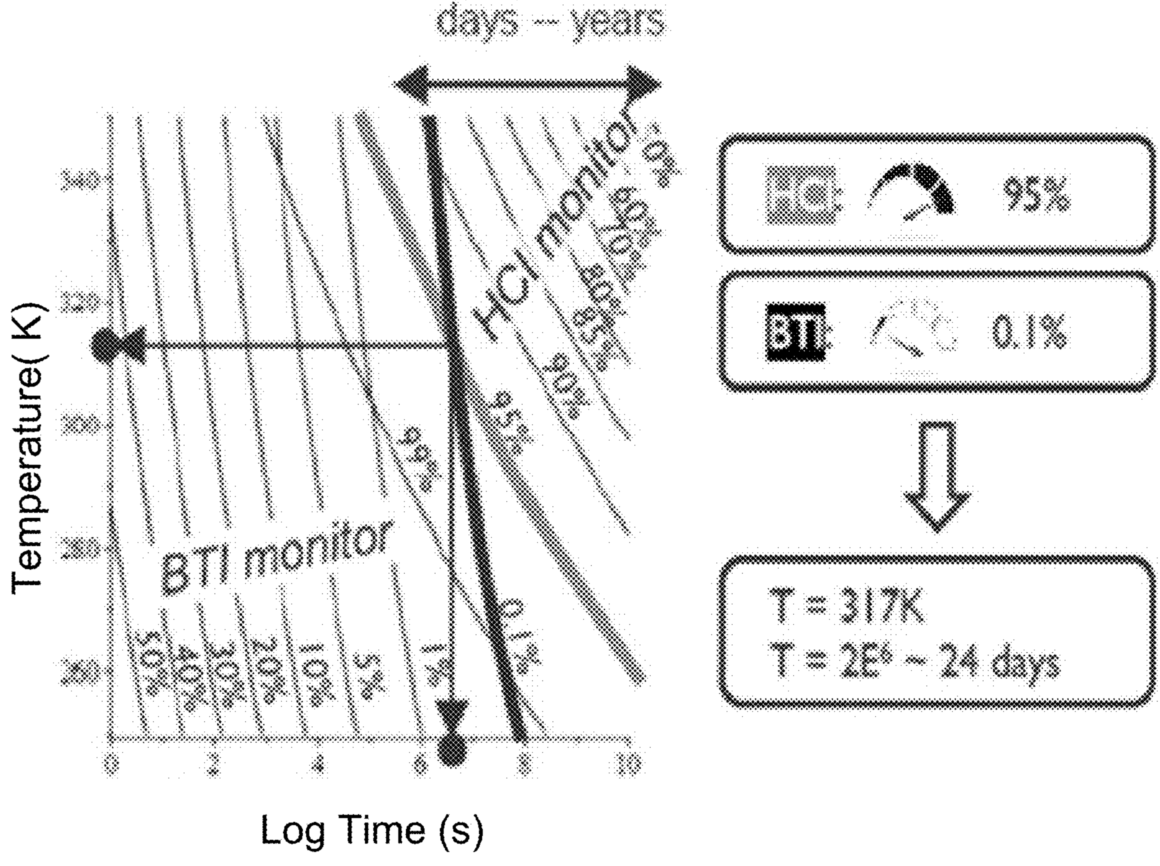
FIG. 8 is a graphical representation of a response model for the performance degradation state of a performance monitor or anneal monitor as a function of operating time and operating temperature, or operating time and operating voltage, according to an example.
Figures 9, 10:
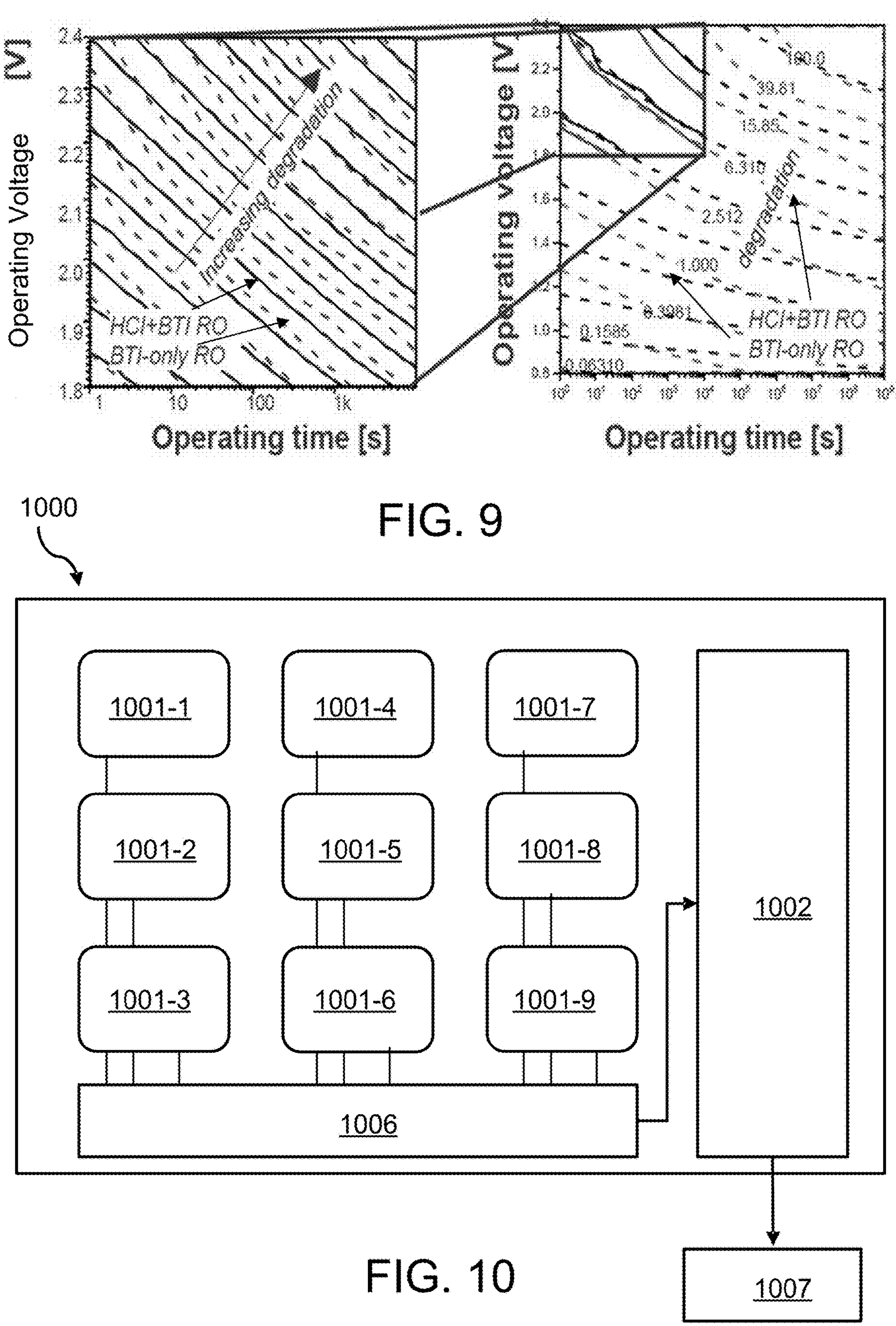
FIG. 9 is a graphical representation of a response model for the performance degradation state of a performance monitor or anneal monitor as a function of operating time and operating temperature, or operating time and operating voltage, according to an example.
FIG. 10 illustrates a test IC which comprises an array of age sensors, according to an example.

The analysis unit 702 is configured to receive and store model descriptions (i.e. models) for the responses r1 to r3 and q1 to q3 in a model storage module 703. The description relates the modeled sensor responses r1 to r3 and q1 to q3 to the measured performance variables R1 to R3 and Q1 to Q3 respectively. FIG. 8 is a graphical representation of a model that uses the combined performance degradation measurements (e.g. in terms of output signal shifts, e.g. frequency shifts) of performance monitors 610, i.e. BTI-only and HCD-enhance performance monitors, to interpolate the pair (T, t) of operating temperature T and operating time t that corresponds to the crossing of performance degradation isolines for the BTI-only and the HCD-enhanced performance monitor respectively. FIG. 9 is a different graphical representation of a model that uses the combined performance degradation measurements (e.g. in terms of output signal shifts, e.g. frequency shifts) of the performance monitor 610-1 and the performance monitor 610-2, i.e. BTI-only and combined BTI+HCD performance monitors, to interpolate the pair (V, t) of applied voltage stress signal (i.e. value of operating voltage of the IC) and operating time t that corresponds to the crossing of performance degradation isolines for the BTI-only and the combined BTI+HCD performance monitor respectively. The two models referred to in FIG. 8 and FIG. 9 can be combined into a single three-dimensional model, which uses readouts from the performance monitor 610-1, the performance monitor 610-2, and the performance monitor 610-3 to determine the triple (V, T, t) of applied voltage stress signal/operating voltage, temperature T, and operating time t that corresponds to the crossing of performance degradation isolines for the three performance monitors.

The response functions, e.g. as graphically represented in FIG. 8 and FIG. 9, may be modeled using an empirical model in which fitting parameters have been predetermined by statistical measurements of the performance monitor output signals under varying stress conditions and for an ensemble of different dies. For instance, a power-law dependence can be used to describe frequency shifts or current shifts ΔS in the output signals of ring oscillator-based performance monitors, e.g. ΔS=A*tn1*Vn2, where the constant A and exponents n1 and n2 are fitting parameters that can be obtained from statistical performance degradation measurements both for static and dynamic voltage stress components. Besides, relaxation behaviors of the BTI effect and the HCD effect can be taken into account by incorporation of the universal recovery model and Stesmans's passivation model, respectively.

Figure 7:
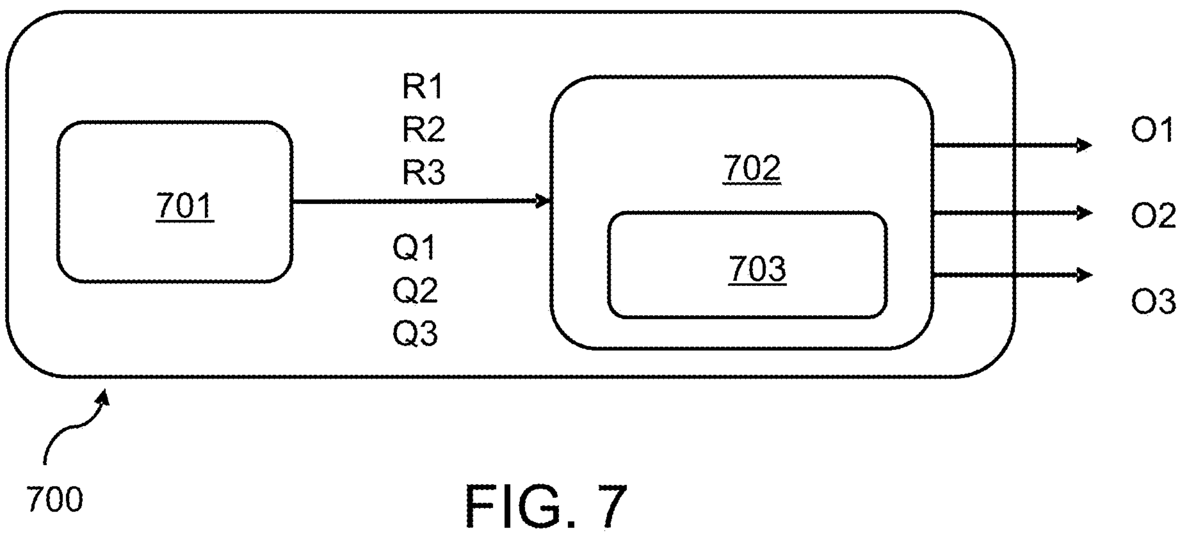
FIG. 7 shows a tamper-aware sensor system, which includes an age sensor and an analysis unit, according to an example.

The analysis unit 702 of FIG. 7 may be a hardware-implemented or software-implemented post-processing unit that is external to the age sensor 701, e.g. an-off chip post-processing unit implemented in hardware or software, which receives the output signals from the on-chip age sensor 701 via a readout unit and data transmission means, e.g. via on-chip I/O circuitry. In other embodiments, the age sensor system may be provided as an integrated system, i.e. an IC die comprising the age sensor and the analysis unit, including the case of an age sensor comprising an analysis unit. Signal or warning O1, signal or warning O2, and signal or warning O3 can be output by the analysis unit with respect to each measurement in the readout mode of the age sensor, and/or for a sequence of such measurements over time. Signal or warning O1, signal or warning O2, and signal or warning O3 that are generated by the analysis unit 702 may comprise degradation status, overvoltage flag, operating age estimate, tamper detection/flag, remaining lifetime of the IC, etc. A sequence of measurements has the potential benefit that it allows the analysis unit 702 to reconstruct a use trajectory for the IC containing the age sensor. The use trajectory describes and links the estimated stress conditions <V(i)stress>, <t(i)stress>, and <T(i)> extracted with respect to each measurement 'i'. This enables the user of a recycled IC to accurately verify the earlier use history of the IC and identify possible risks related to overheating, anneal attacks, overvoltage conditions, overclocking, and operating times of the IC which seem abnormal in view of the intended applications, etc.

According to embodiments, an IC or IC die includes at least one tamper-aware age sensor. Typically, one or more empty spaces in the design layout of the IC are allotted to the layout blocks of the age sensor(s). A single age sensor is often sufficient to obtain the necessary age estimates for the IC. However, embodiments using several on-chip age sensors, e.g. an array or irregular structure of age sensors, located adjacent one to another or distributed over the IC, may be useful if different portions of the IC experience different aging mechanisms. For instance, the IC is adapted to provide different operating voltages to different circuits or components that are part of the IC or if different portions of the IC experience different cooling/thermal conduction or are operable with digital or analog signals, different clock speeds, etc. Instead of providing many different age sensors, one larger age sensor may be provided which includes a plurality of performance monitors and/or a plurality of anneal sensors. Different performance sensors may then be configured to receive different operating voltages, switch on and off (during regular use mode) at different frequencies, etc.

An example of an IC 1000 including an array of age sensors 1001 (i.e. the age sensor 1001, the age sensor 1002, the age sensor 1003, the age sensor 1004, the age sensor 1005, the age sensor 1006, the age sensor 1007, the age sensor 1008, and the age sensor 1009) is shown in FIG. 10. Only nine age sensors are shown for the sake of clarity, but the IC 1000 may comprise a much larger array of age sensors, e.g. hundreds of age sensors. The age sensors 1001 may correspond to replicated unit cells of a single layout design for the age sensor. The IC 1000 may be a test IC of a test wafer which can be used to obtain ensemble statistics such as wafer statistics, die-to-die fabrication variability, and intra-die fabrication variability. For instance, ensemble statistics with respect to the die-to-die fabrication variability of the oscillation frequency of ring oscillator-based performance and anneal monitors in the age sensors (e.g. respective mean values and standard deviations, but not limited thereto) can be gathered more easily with specially designed test ICs. Age sensors 1001 The IC 1000 further contains an on-chip readout unit 1006, e.g. corresponding to readout units described hereinabove, and I/O circuitry 1002 configured to send performance degradation measurement results off-chip, e.g. towards an off-chip analysis unit 1007. Various additional components may be provided on the IC 1000, for instance a layered shift register for individually addressing the plurality of age sensors on the die, output pads for needle-probing individual age sensors on the chip, voltage supply lines and voltage sources for supplying the nominal operating voltage and measurement voltage to the age sensors of the array (e.g. force-sense arrangements for biasing the age sensors and reading out the output signals at the same time), and others.

The present disclosure also relates to a method for manufacturing an age sensor according to the disclosure. The method comprises the steps of:

- providing at least one performance monitor and at least one anneal monitor, wherein the at least one performance monitor and at least one anneal monitor are responsive to voltage stress and temperature stress and configured to generate an output signal that is indicative of a degradation state of the respective monitor;
- subjecting the at least one anneal monitor to a voltage stress signal, by applying the voltage stress signal to an input connector of the at least one anneal monitor, whereby pre-stressing of the at least one anneal monitor is obtained through accelerated aging/degradation under the applied voltage stress signal; and
- permanently disconnecting or isolating the input connector of the at least one anneal monitor so that it becomes inaccessible during any further application of the voltage stress signal.

In an embodiment, the age sensor is fabricated on a semiconductor die or chip, e.g. a packaged semiconductor chip or die that contains the IC of which the aging is to be monitored.

In embodiments, no pre-stressing of the at least one performance monitor is performed at the time of fabrication, e.g. the at least one performance monitor is substantially free of initial stress at the time the purchaser starts using the IC with the age sensor.

The disconnecting or isolating step may comprise blowing a fuse provided in a fusible portion of the input connector of the at least one anneal sensor. This step may occur simultaneously to the step of pre-stressing the at least one anneal monitor, for example if the blowing of a fusible portion of the input connector terminates the pre-stressing step as a result of an open circuit or non-conductive gap being formed in the input connector.

The pre-stressing of the at least one anneal monitor may include pre-stressing the at least one anneal monitor long enough to accumulate a predetermined amount of performance degradation, e.g. long enough to observe a measurable shift in the output signal generated by the at least one anneal monitor relative to a reference value for the generated output signal. This reference value may correspond to an average value of the performance state of the at least one anneal monitor prior to the pre-stressing thereof, wherein the average is a statistical average calculated over an ensemble of anneal monitors located in different positions of a same die and/or located on different dies.

The step of pre-stressing of the at least one anneal monitor may include applying a constant voltage signal, e.g. larger than the nominal operating voltage of the IC to be monitored, e.g. at least twice the nominal operating voltage, during a predetermined time period, performing constant current-forcing during a predetermined time period, or a combination of both. More generally, the applied voltage stress signal, or forced current inducing a voltage stress signal, may be varied over time in accordance with a stress protocol.

In embodiments, a plurality of performance monitors and/or a plurality of anneal monitors may be provided, wherein pre-stressing is performed for each anneal monitor. Different performance monitors may be specifically adapted to enhance a particular aging mechanism compared to other aging mechanisms, e.g. enhancing the BTI or the HCD aging mechanism. Different performance monitors may be specifically adapted to obtain a predetermined weighting of the contributions of each aging mechanism affecting the performance state of the performance monitor.

Performance and/or anneal monitors may be provided as ring oscillators.

In a further aspect, the disclosure relates to a method for detecting fraudulent anneal attempts in an age-monitored integrated circuit. The method comprises the steps of:

- providing an age sensor according to the first aspect of the disclosure, preferably by carrying out the steps of the manufacturing method according to the second aspect of the disclosure;
- detecting a performance degradation of the at least one anneal monitor; and
- signaling anneal tampering if the detected performance degradation of the at least one anneal monitor falls below a predetermined threshold value.

In embodiments, the method may also include the steps of:

subjecting the at least one performance monitor of the age sensor to regular voltage stress, by applying a nominal operating voltage of the integrated circuit to an input of the at least one performance monitor, while the at least one pre-stressed anneal monitor is not subjected to any voltage stress;

detecting a performance degradation of the at least one performance monitor; and estimating an operating age of the age-monitored integrated circuit based on the detected performance degradation of the at least one performance monitor, provided that no anneal tampering has been signaled.

Detecting the performance degradation of the at least one performance monitor, e.g. each performance monitor, may include detecting a shift in the output signal generated by the at least one performance monitor and/or detecting a shift in a performance variable derived from the output signal generated by the at least one performance monitor. The shift in the output signal generated by the at least one performance monitor and/or the shift in a performance variable derived from the output signal generated by the at least one performance monitor may be detected relative to a reference value for the output signal and/or performance variable derived from the output signal. The reference value may correspond to an average value of the performance state of the at least one performance monitor at the time of fabrication, or immediately following fabrication, i.e. prior to the step of subjecting the at least one performance monitor to regular voltage stress, wherein the average is a statistical average calculated over an ensemble of anneal monitors located in different positions of a same die and/or located on different dies. Alternatively, the shift in the output signal generated by the at least one performance monitor or the shift in a performance variable derived from the output signal generated by the at least one performance monitor may be detected relative to an output signal of a reference device, or relative to a performance variable derived from the output signal of a reference device. This may include superimposing the output signals generated by the at least one performance monitor and the reference device, e.g. beating of the two output signals. The reference device is not subjected to voltage stress when the at least one performance monitor is subjected to voltage stress. All the preceding steps may also be applied to the at least one anneal monitor, e.g. each anneal monitor.

In an embodiment, the shift in the output signal generated by the at least one performance monitor corresponds to a frequency shift of a ring oscillator. In alternative embodiments, the shift in the output signal generated by the at least one performance monitor may correspond to a current shift of a current monitor, a load or leakage current shift in a transistor device (e.g. FET), a threshold voltage shift in a transistor device (e.g. FET), or others.

The step of subjecting the at least one performance monitor to regular voltage stress may include repeatedly connecting and disconnecting the at least on performance monitor to and from a voltage stress signal line. The connecting and disconnecting may occur at regular time intervals, which are preferably proportional to a workload or activity measure of the IC that is monitored by the age sensor.

In embodiments, the operating age of the monitored integrated circuit may be estimated by providing a response model for each performance monitor of the age sensor, and determining the operating time using the response models and the detected performance degradation of each performance monitor as input to the response models. The response models describe the functional relationship between the detected performance degradation on the one hand and operating time, voltage stress, and operating temperature on the other hand.

In addition to the operating time (i.e. age), other operating conditions of the performance monitor(s), and integrated circuit containing the same, can be determined from the response model, including for example the applied voltage stress signal and the operating temperature. Therefore, overvoltage and/or overtemperature conditions may be signaled too.

The step of estimating the operating age may be repeated with respect to a plurality of moments in time. A use trajectory for the age-monitored integrated circuit may be obtained from the determined values of operating age, stress voltage and temperature at the plurality of moments in time. The true physical age of the monitored integrated circuit may be derived from the use trajectory.

In embodiments, the response models take the relaxation behavior of the different aging mechanisms into account.

Other variations to the disclosed embodiments can be understood and effected by those skilled in the art in practicing the disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used. Any reference signs in the claims should not be construed as limiting the scope.

The invention claimed is:

1. A sensor comprising:

a performance monitor configured to be responsive to temperature stress and voltage stress, wherein the performance monitor is configured to receive a nominal operating voltage of an integrated circuit as an input signal when the sensor is operated in a regular use mode, thereby causing the performance monitor to experience a first performance degradation, wherein the performance monitor is configured to generate a first output signal indicative of the first performance degradation when the sensor is operated in a readout mode; and an anneal monitor configured to be responsive to temperature stress, wherein the anneal monitor is pre-stressed and configured to account for a first accelerated relaxation of the first performance degradation during a fraudulent anneal attempt and account for a second accelerated relaxation of a second performance degradation of the anneal monitor during the fraudulent anneal attempt, wherein the anneal monitor is configured to generate a second output signal indicative of the second performance degradation.

2. The sensor of claim 1, wherein the performance monitor is substantially free of initial stress to account for performance degradation of the integrated circuit during use.

3. The sensor of claim 1, wherein an amount of pre-stress applied to the anneal monitor corresponds to a difference between the second performance degradation and a reference value, the difference being at least 20% of the reference value.

4. The sensor of claim 3, wherein the reference value corresponds to a statistical average of a performance state indicated by a third output signal generated by an unstressed replica of the anneal monitor, the statistical average being formed with respect to age sensors distributed on one or more integrated circuit dies.

5. The sensor of claim 1, wherein an amount of pre-stress applied to the anneal monitor corresponds to a difference between the second performance degradation and a predetermined reference value, the difference being equal to or greater than a sum of a predetermined amount of performance degradation relaxation in the anneal monitor and a predetermined amount of inter-die and/or intra-die variability in performance degradation of an unstressed replica of the anneal monitor, wherein the predetermined amount of performance degradation relaxation corresponds to an extrapolated amount of performance degradation relaxation in the anneal monitor at an end of lifetime of the sensor, provided that the sensor is not subjected to a fraudulent anneal attempt.

6. The sensor of claim 1, wherein the performance monitor comprises a first multi-stage ring oscillator and the anneal monitor comprises a second multi-stage ring oscillator.

7. The sensor of claim 6, wherein the first multi-stage ring oscillator includes a controllable switch in a feedback connection of the first multi-stage ring oscillator configured for selectively enabling and disabling feedback in the first multi-stage ring oscillator.

8. The sensor of claim 1, further comprising a readout unit configured to detect the first output signal and the second output signal and to determine, based on the first output signal and the second output signal, a first performance variable for the performance monitor and a second performance variable for the anneal monitor, wherein the first performance variable are is a digital representation of a first performance state of the performance monitor and the second performance variable is a digital representation of a second performance state of the anneal monitor, wherein the readout unit comprises a frequency counter and comprises frequency divider stages.

9. The sensor of claim 8, the readout unit comprising a reference ring oscillator and a beat frequency detection unit configured to detect a beat frequency in a superimposition of output signals generated by the reference ring oscillator and a further ring oscillator of the performance monitor.

10. A sensor system comprising the sensor of claim 8 and an analysis unit configured to receive the first performance variable and the second performance variable, detect a change in the first performance variable or the second performance varaible, and based thereon, generate an estimate of an operating age of the integrated circuit.

11. The sensor system of claim 10, wherein the analysis unit is further configured to detect a change in the second performance variable, and signal a fraudulent anneal attempt if the change in the second performance variable exceeds a predetermined threshold value.

12. The sensor system of claim 11, wherein the analysis unit comprises a model storage module configured for storing a first response model of the performance monitor and a second response model of the anneal monitor, the first response model relating a first set of operating conditions for the integrated circuit to the first performance variable and the second response model relating a second set of operating conditions for the integrated circuit to the second performance variable, wherein the first set of operating conditions or the second set of operating conditions includes a predicted operating time and a predicted operating temperature of the integrated circuit, and wherein the analysis unit is configured to determine, based on the first response model or the second response model, the first set of operating conditions or the second set of operating conditions from the first performance variable or the second performance variable.

13. The sensor system of claim 12, wherein the first set of operating conditions or the second set of operating conditions further includes the nominal operating voltage.

14. The sensor system of claim 10, comprising a plurality of performance monitors, each performance monitor of the plurality being specifically adapted to respond to voltage stress via a pre-selected combination of aging mechanisms degrading performance of the performance monitor.

15. The sensor system of claim 14, wherein a first performance monitor of the plurality of performance monitors is adapted to respond to voltage stress via a bias temperature instability aging mechanism and a second performance monitor of the plurality of performance monitors is adapted to respond to voltage stress via a combination of the bias temperature instability aging mechanism and a hot carrier injection aging mechanism.

16. The or sensor system of claim 15, wherein the second performance monitor is adapted to enhance the hot carrier injection aging mechanism relative to the bias temperature instability aging mechanism.

17. A method for detecting fraudulent anneal attempts in an age-monitored integrated circuit, comprising:

providing the sensor according to claim 1;

detecting a performance degradation of the anneal monitor of the sensor; and signaling anneal tampering if the performance degradation of the anneal monitor becomes less than a predetermined threshold value.

18. The method of claim 17, further comprising:

subjecting the performance monitor to regular voltage stress by applying a nominal operating voltage of the integrated circuit to an input of the performance monitor while the anneal monitor is not subjected to voltage stress;

detecting a performance degradation of the performance monitor; and estimating an operating age of the integrated circuit based on the first performance degradation of the performance monitor, provided that no anneal tampering has been signaled.

19. The method of claim 17, wherein providing the sensor includes:

providing the performance monitor and the anneal monitor;

subjecting the anneal monitor to a voltage stress signal by applying the voltage stress signal to an input connector of the anneal monitor, whereby pre-stressing of the anneal monitor is obtained through accelerated degradation under the voltage stress signal; and permanently isolating the input connector of the anneal monitor so that the input connector becomes inaccessible during any further application of the voltage stress signal.

20. The method of claim 19, wherein permanently isolating the input connector comprises:

blowing a fuse provided in a fusible portion of the input connector, wherein said blowing of the fuse occurs simultaneously to the pre-stressing of the anneal monitor.

* * * * *